(12) United States Patent
Chen et al.

(10) Patent No.: US 8,596,731 B2
(45) Date of Patent: Dec. 3, 2013

(54) INSTALLATION SUPPORT UNIT FOR SLIDE ASSEMBLY

(75) Inventors: Ken-Ching Chen, Kaohsiung (TW); Chien-Li Huang, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 128 days.

(21) Appl. No.: 13/195,099

(22) Filed: Aug. 1, 2011

(65) Prior Publication Data
US 2013/0032678 A1 Feb. 7, 2013

(51) Int. Cl.
*A47B 88/00* (2006.01)

(52) U.S. Cl.
USPC .......... 312/334.1; 312/330.1; 312/334.8

(58) Field of Classification Search
USPC ............ 248/298.1, 224.8, 223.21; 312/249.4, 312/249.11, 330.1, 334.1, 334.8, 334.32, 312/334.4, 334.5, 223.1, 334.7, 312/265.1–265.4; 211/192, 151, 162
See application file for complete search history.

(56) References Cited

U.S. PATENT DOCUMENTS

| | | | | |
|---|---|---|---|---|
| 5,833,337 | A * | 11/1998 | Kofstad | 312/334.5 |
| 6,926,378 | B2 * | 8/2005 | Greenwald et al. | 312/334.4 |
| 8,322,668 | B2 * | 12/2012 | Tang et al. | 248/222.14 |
| 2005/0156493 | A1 * | 7/2005 | Yang et al. | 312/334.5 |

* cited by examiner

*Primary Examiner* — Alfred J Wujciak
(74) *Attorney, Agent, or Firm* — Rosenberg, Klein & Lee

(57) ABSTRACT

An installation support unit includes a base board, a support member, two installation members and a locking member. An end board extends from the base board and has a bent portion. The support member has a face board and an elongate hole. Each of the installation members is connected to the support member which is fixed to the end board. The locking member is movably connected to the support member and the end board, and includes a head portion, a protrusion and a threaded hole defined through the head portion and the protrusion. The diameter of the protrusion is smaller than the transverse width of the elongate hole. The protrusion extends through the elongate hole, and the height of the head portion is longer than the longitudinal distance of the elongate hole. The head portion is movably clamped between the support member and the end board.

9 Claims, 6 Drawing Sheets

INSTALLATION SUPPORT UNIT FOR SLIDE ASSEMBLY

FIELD OF THE INVENTION

The present invention relates to an installation support unit, and more particularly, to an adjustable installation support unit for a slide assembly.

BACKGROUND OF THE INVENTION

U.S. Pat. No. 7,930,812 to Curnalia discloses a "Toolless rack mounting rail installation latch" which generally includes an end board with two pins 1320, 1352 and a press-nut 1350, wherein the two pins extend through holes in one of the uprights 110, 112, 114 or 116 of a rack system 100. The press-nut accommodates a bolt which is then connected to the press-nut so that the end of the installation support unit is securely connected to the upright of the rack system.

However, the press-nut 1350 on the end board of the installation support unit cannot be adjusted, so that when an apparatus is installed to the installation support unit by extending the bolt through the hole in the upright of the rack system and connected with the press-nut. If the press-nut is located to be offset from the bolt, the bolt cannot be successfully connected with the press-nut after extending through the hole in the upright, and the apparatus cannot be firmly and stably connected to the rack system. This may damage the apparatus due to vibration or impact during transportation.

The present invention intends to provide an installation support unit to improve the existed shortcomings.

SUMMARY OF THE INVENTION

The present invention relates to an installation support unit for a slide assembly and the installation support unit comprises a base board and an end board extending from the base board and has a bent portion relative to the base board. A support member has a face board having an elongate hole. A first installation member is connected to the support member which is fixed to the end board. A second installation member is connected to the support member which is fixed to the end board. A locking member is movably connected to the support member and the end board. The locking member has a head portion and a protrusion. A threaded hole is defined through the head portion and the protrusion. The diameter of the protrusion is smaller than a transverse width of the elongate hole of the face board. The protrusion extends through the elongate hole of the face board. The height of the head portion is longer than the longitudinal distance of the elongate hole of the face board. The head portion is movably clamped between the support member and the end board.

Preferably, one of the support member and the end board has a space in which the head portion of the locking member is located.

Preferably, the depth of the space is larger than or equal to a thickness of the head portion of the locking member.

Preferably, the space is located in the face board of the support member and the elongate hole is enclosed by the space.

Preferably, the space is located in the end board and corresponding to the elongate hole.

Preferably, each of the face board and the end board has a recess which is located corresponding to the elongate hole of the support member, and the two respective recesses form the two spaces.

Preferably, a sum of depths of the recesses is larger than or equal to a thickness of the head portion of the locking member.

Preferably, the space is formed by making the elongate hole to be countersink hole, and the head portion of the locking member has a tapered outer surface.

The primary object of the present invention is to provide an adjustable installation support device which allows the locking member to be transversely adjusted relative to the support unit to secure the rack system by the locking member for convenience of transportation.

The locking member of the installation support device is adjustable according to the practical needs, especially when the locking mechanism of the rack system is slightly different in arrangement or a tolerance is found in the rack system. By the adjustment of the locking member, the rack system can be well positioned and secured during transportation.

The present invention will become more obvious from the following description when taken in connection with the accompanying drawings which show, for purposes of illustration only, a preferred embodiment in accordance with the present invention.

DETAILED DESCRIPTION OF THE PREFERRED EMBODIMENT

Figure 1:
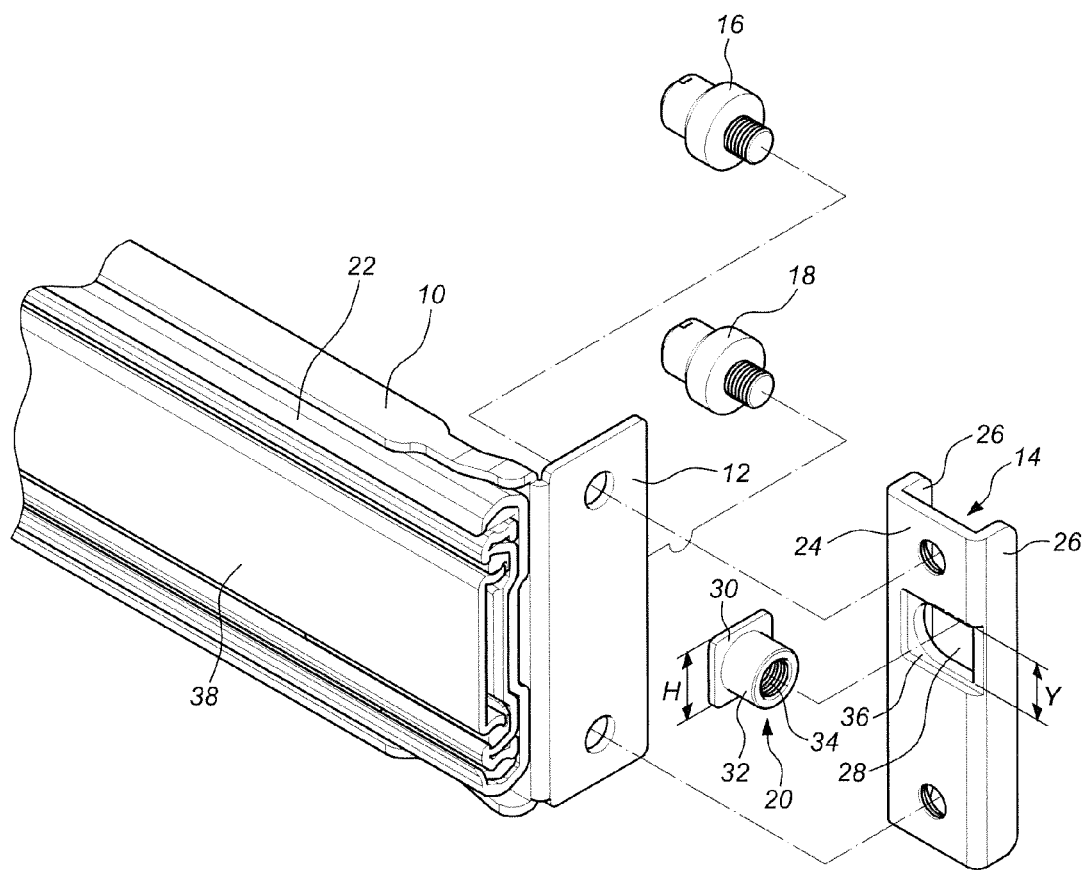
FIG. 1 is an exploded view to show the installation support unit of the present invention.
Figure 2:
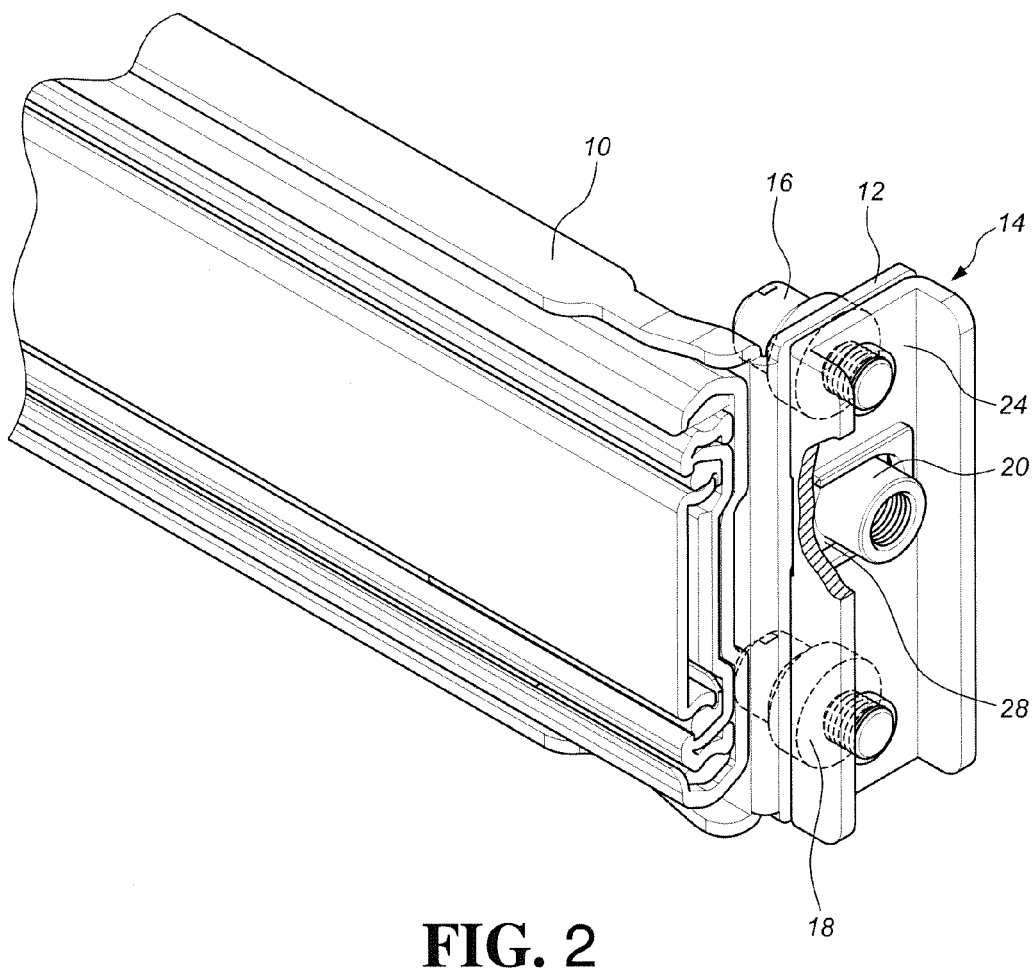
FIG. 2 is a perspective view to show the installation support unit of the present invention.

Referring to FIGS. 1 and 2, the installation support unit for slide assembly of the present invention comprises a base board 10, an end board 12, a support member 14, a first installation member 16, a second installation member 18 and a locking member 20.

The base board 10 is connected to an outer rail 22 of a slide assembly and the end board 12 extends from the base board 10 and has a bent portion relative to the base board 10.

The support member 14 has a face board 24 and two sidewalls 26 which perpendicularly extend from two sides of the face board 24. The face board 24 has an elongate hole 28.

The first installation member 16 is connected to the support member 14 which is fixed to the end board 12.

The second installation member 18 is connected to the support member 14 which is fixed to the end board 12.

Figure 3:
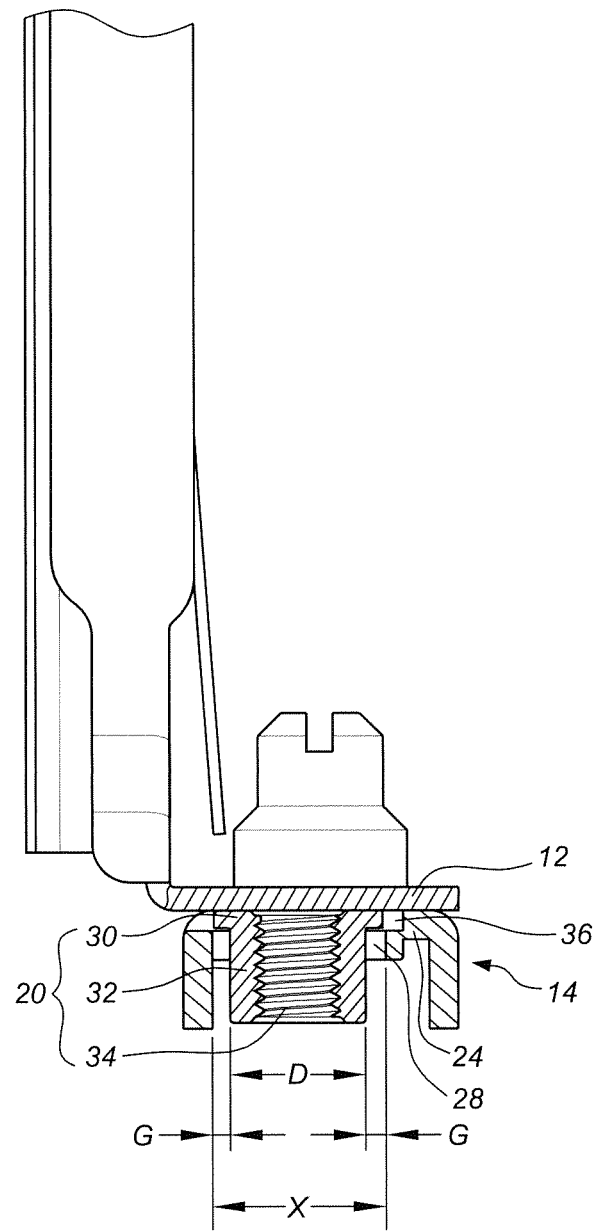
FIG. 3 is a partial cross sectional view to show the head portion of the locking member and the support member of the installation support unit of the present invention.

The locking member 20 is movably connected to the support member 14 and the end board 12. The locking member 20 has a head portion 30, a protrusion 32 and a threaded hole 34 which is defined through the head portion 30 and the protrusion 32. The head portion 30 is connected to the protrusion 32. As shown in FIG. 3, the diameter D of the protrusion 32 is smaller than the transverse width X of the elongate hole 28 of the face board 24. Accordingly, a gap G is defined between the protrusion 32 and an inner wall of the elongate hole 28 so that the protrusion 32 is movable transversely in the elongate hole 28. The protrusion 32 extends through the elongate hole 28 of the face board 24. The height H of the head portion 30 is longer than the longitudinal distance Y of the elongate hole 28 of the face board 24 as shown in FIG. 1 so that the locking member 20 cannot be disengaged from the elongate hole 28. The head portion 30 is movably clamped between the support member 14 and the end board 12.

The face board 24 of the support member 14 has a space 36 corresponding in position to and enclosing the elongate hole 28. The head portion 30 of the locking member 20 is located in the space 36. Preferably, the depth of the space 36 is larger than or equal to the thickness of the head portion 30 of the locking member 20.

Figure 4:
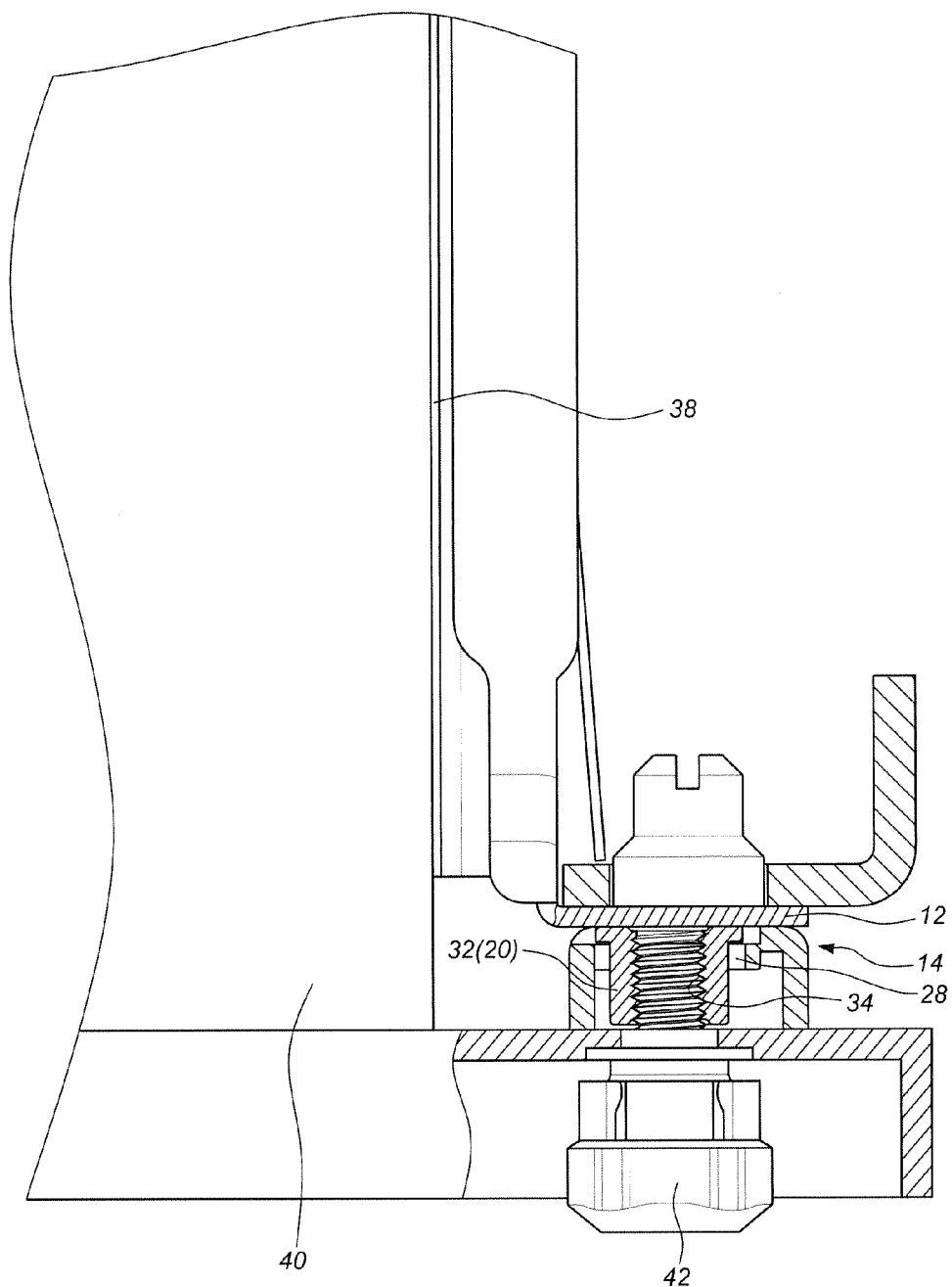
FIG. 4 is a partial cross sectional view to show that the locking member and the bolt secure a rack system.

FIG. 4 shows that a chassis 40 is connected an inner rail 38 of the slide assembly and a bolt 42 is threadedly connected to the threaded hole 34 of the locking member 20. When the chassis 40 is pushed into a rack and positioned in the rack by operation of the slide assembly, because the locking member 20 is movably connected to the support member 14 and the end board 12, the locking member 20 is cooperated with the bolt 42 and adjusted to connect the bolt 42 to the threaded hole 34 of the protrusion 32 of the locking member 20 and to position the chassis 40 to the rack. Besides, the bolt 42 and the locking member 20 ensure that the chassis 40 is locked without worry of shaking in the rack during transportation, or even slipping off from the rack.

Figure 5:
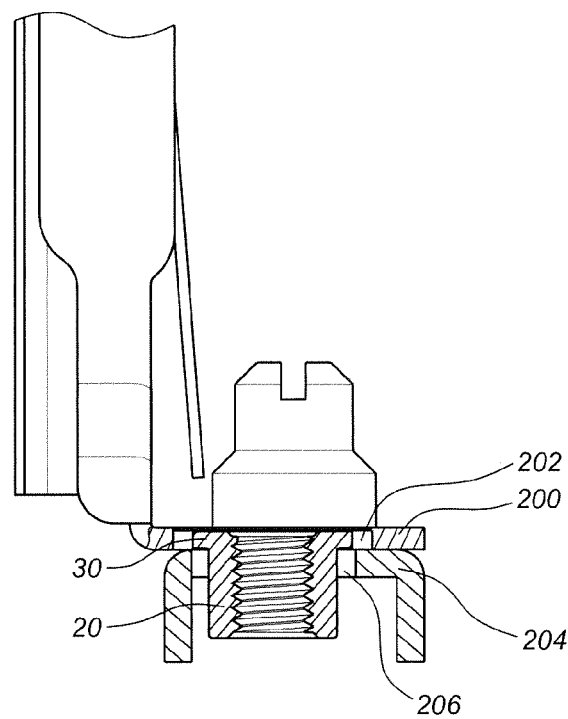
FIG. 5 is a partial cross sectional view to show the head portion of the locking member and the end board of the second embodiment of the installation support unit of the present invention.

In the second embodiment, as shown in FIG. 5, the space 202 is located in the end board 200 and corresponding to the elongate hole 206 of the support member 204. Preferably, the depth of the space 202 is larger than or equal to the thickness of the head portion 30 of the locking member 20.

Figure 6:
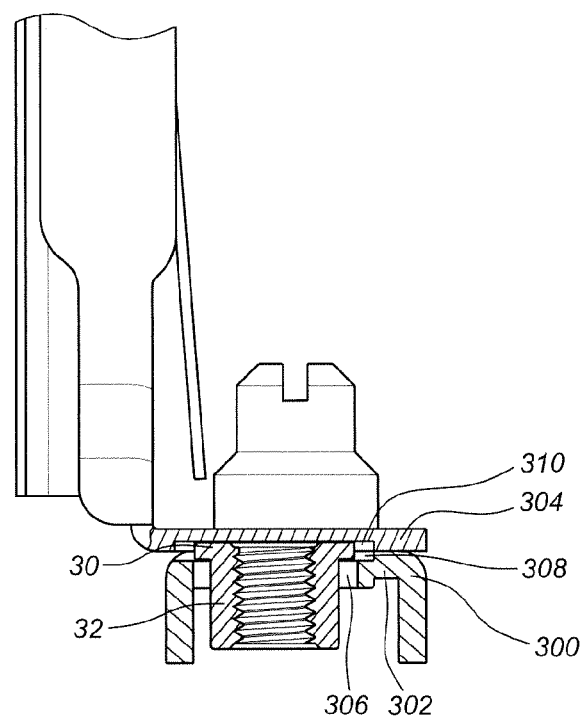
FIG. 6 is a partial cross sectional view to show the head portion of the locking member and the end board of the third embodiment of the installation support unit of the present invention.

In the third embodiment, as shown in FIG. 6, each of the face board 302 and the end board 304 has a recess which is located corresponding to the elongate hole 306 of the support member 300, and the two respective recesses form the two spaces 308, 310. Preferably, the sum of depths of the spaces 308, 310 formed by the recesses is larger than or equal to the thickness of the head portion 30 of the locking member 20.

Figure 7:
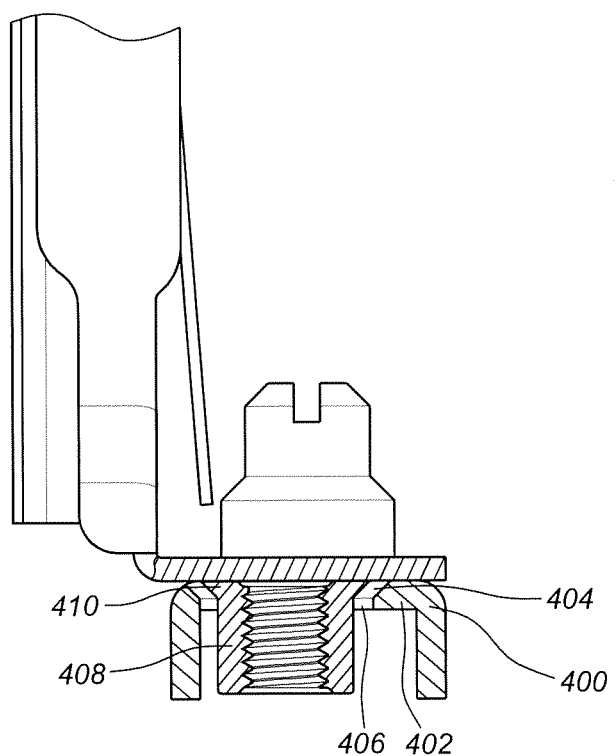
FIG. 7 is a partial cross sectional view to show the head portion of the locking member and the support member of the third embodiment of the installation support unit of the present invention.

In the fourth embodiment, as shown in FIG. 7, the space 404 is defined in the face board 402 of the support member 400 and the space 404 formed by making the elongate hole 406 to be a countersink hole, and the head portion 30 of the locking member 20 has a tapered outer surface.

The locking member of the installation support device is adjustable according to the practical needs, especially when the locking mechanism of the rack system is slightly different in arrangement or a tolerance is found in the rack system. By the adjustment of the locking member, the rack system can be well positioned and secured during transportation.

While we have shown and described the embodiment in accordance with the present invention, it should be clear to those skilled in the art that further embodiments may be made without departing from the scope of the present invention.

What is claimed is:

1. An installation support unit for slide assembly in a rack system, comprising:
   a base board;
   an end board extending from the base board and having a bent portion relative to the base board;
   a support member having a face board which has an elongate hole;
   a first installation member connected to the support member which is fixed to the end board;
   a second installation member connected to the support member which is fixed to the end board, and
   a locking member movably connected to the support member and the end board, the locking member having a head portion and a protrusion, a threaded hole defined through the head portion and the protrusion, a diameter of the protrusion being smaller than a transverse width of the elongate hole of the face board, the protrusion extending through the elongate hole of the face board, a height of the head portion being longer than a longitudinal distance of the elongate hole of the face board, the head portion being movably clamped between the support member and the end board for transverse displacement of the protrusion along the elongate hole.

2. The installation support unit as claimed in claim 1, wherein one of the support member and the end board has a space in which the head portion of the locking member is located.

3. The installation support unit as claimed in claim 2, wherein a depth of the space is at least equal to a thickness of the head portion of the locking member.

4. The installation support unit as claimed in claim 3, wherein the space is located in the end board and corresponding to the elongate hole.

5. The installation support unit as claimed in claim 3, wherein each of the face board and the end board has a recess which is located corresponding to the elongate hole of the support member, the two respective recesses form the two spaces.

6. The installation support unit as claimed in claim 5, wherein a sum of depths of the recesses is larger than or equal to a thickness of the head portion of the locking member.

7. The installation support unit as claimed in claim 3, wherein the space is formed by making the elongate hole to be a countersink hole, the head portion of the locking member has a tapered outer surface.

8. The installation support unit as claimed in claim 3, wherein the space is located in the face board of the support member and the elongate hole is enclosed by the locking member.

9. An installation support unit for slide assembly in a rack system, comprising:
   a base board;
   an end board extending from the base board and having a bent portion relative to the base board;
   a support member having a face board which has an elongate hole;
   a first installation member connected to the support member which is fixed to the end board;
   a second installation member connected to the support member which is fixed to the end board, and
   a locking member movably connected to the support member and the end board, the locking member having a head portion and a protrusion, a threaded hole defined through the head portion and the protrusion, a diameter of the protrusion being smaller than a transverse width of the elongate hole of the face board, the protrusion extending through the elongate hole of the face board, a height of the head portion being longer than a longitudinal distance of the elongate hole of the face board, the head portion being movably clamped between the support member and the end board, wherein at least the support member has a space in which the head portion of the locking member is located and a depth of the space is at least equal to a thickness of the head portion of the locking member, wherein the space is located in the face board of the support member and the elongate hole is enclosed by the locking member.

* * * * *